United States Patent
Cho et al.

(10) Patent No.: US 6,828,861 B2
(45) Date of Patent: Dec. 7, 2004

(54) POWER AMPLIFIER WITH DISTRIBUTED CAPACITOR

(75) Inventors: Jin Wook Cho, Plantation, FL (US); Hongxi Xue, Coral Springs, FL (US)

(73) Assignee: Mediatek Incorporation, Hsin-Chu Hsien (TW)

( * ) Notice: Subject to any disclaimer, the term of this patent is extended or adjusted under 35 U.S.C. 154(b) by 45 days.

(21) Appl. No.: 10/604,649

(22) Filed: Aug. 7, 2003

(65) Prior Publication Data

US 2004/0164804 A1 Aug. 26, 2004

Related U.S. Application Data

(63) Continuation of application No. 10/064,515, filed on Jul. 23, 2002, now Pat. No. 6,686,801.

(51) Int. Cl.[7] .............................................. H03F 3/68
(52) U.S. Cl. ................................... 330/295; 330/124 R
(58) Field of Search ............................ 330/295, 124 R, 330/84

(56) References Cited

U.S. PATENT DOCUMENTS

| | | | |
|---|---|---|---|
| 5,321,279 A | 6/1994 | Khatibzadeh | |
| 5,629,648 A | 5/1997 | Pratt | |
| 6,448,859 B2 | 9/2002 | Morizuka | |
| 2001/0024141 A1 | * | 9/2001 | Kurlyama |

* cited by examiner

Primary Examiner—Henry Choe
(74) Attorney, Agent, or Firm—Winston Hsu

(57) ABSTRACT

A power amplifier integrated circuit includes a plurality of heterojunction bipolar transistors having a plurality of bases, a plurality of ballast resistors, and a capacitor. Each ballast resistor is connected between a base of the transistors and a DC node to which a DC voltage is applied. The capacitor is connected between an RF node, which supplies an RF signal, and the plurality of bases of the transistors. The capacitor provides a distinct path for the RF input signal having a substantially high capacitance, so that the RF input signal does not suffer significant signal loss.

15 Claims, 4 Drawing Sheets

POWER AMPLIFIER WITH DISTRIBUTED CAPACITOR

CROSS REFERENCE TO RELATED APPLICATIONS

This is a continuation of application Ser. No. 10/064,515, filed Jul. 23, 2002 now U.S. Pat. No. 6,686,801. The specification and drawings are carried forward from said application without amendment.

BACKGROUND OF INVENTION

1. Field of the Invention

The present invention relates to a power amplifier integrated circuit employed in wired or wireless system application, and more specifically, to a power amplifier integrated circuit having a distributed capacitor.

2. Description of the Prior Art

Power amplifier integrated circuits have been widely used in different kinds of wired or wireless system applications. Power amplifier integrated circuits such as those employing heterojunction bipolar transistors operate with elevated junction temperatures. High junction temperatures degrade device reliability and limit maximum current density, and thus maximum power, of the power amplifier.

When operated at high power, power amplifier integrated circuits can suffer thermal runaway where, because of emitter current non-uniformity or temperature profile non-uniformity, an emitter of the power amplifier integrated circuit conducts an increasing amount of current until catastrophic device failure. Operating at high power also reduces the device life and mean time to failure (MTTF). Moreover, a larger device is mandated for a given application when a power amplifier integrated circuit cannot operate at a required power.

Please refer to FIG. 1. FIG. 1 shows a prior art heterojunction bipolar transistor power amplifier 10. Typically, the power amplifier 10 includes a plurality of emitter fingers and base fingers. Accordingly, the power amplifier 10 is an equivalent circuit comprising transistors 12a–12c. The power amplifier 10 further includes ballasting resistors 14a–14c to stabilize the transistors 12a–12c when operating with a high current density, and bypass capacitors 16a–16c in parallel with the ballasting resistors 14a–14c. An RF input signal and DC voltage are supplied through a common input node 18 and output is taken from the collector nodes 20. The power amplifier 10 is further described by Khatibzadeh et al. in U.S. Pat. No. 5,321,279, which is included herein by reference. While, the ballasting resistors 14a–14c provide device stability, they also undesirably reduce the overall gain of the power amplifier 10.

FIG. 2 shows a second prior art power amplifier as described by Pratt in U.S. Pat. No. 5,629,648, which is included herein by reference. Similar to the power amplifier 10, the power amplifier 30 comprises transistors 32a–32c and ballasting resistors 34a–34c. Bypass capacitors 36a–36c are also provided. An RF signal can be applied at a node 38, a DC voltage can be applied at a node 39, and a corresponding output can be taken from collector nodes 40. However, use of capacitors 36a–36c is inefficient and mandates an overly complicated layout.

Generally, the prior art power amplifier circuits provide power amplifier stability at the cost of gain, and do so in an inefficient way. Moreover, layout of the prior art power amplifier integrated circuits is inefficient.

SUMMARY OF INVENTION

It is therefore a primary objective of the present invention to provide a power amplifier having a distributed capacitor to solve the problems of the prior art.

According to one preferred embodiment of the present invention, the power amplifier includes a plurality of transistors. Each transistor has a base and a ballast resistor having a first terminal and a second terminal. The embodiment further comprises a DC node, an RF node, and a capacitor having a third terminal and a fourth terminal. The first terminal of each ballast resistor is connected to a base of the plurality of bases, and the second terminal of each ballast resistor is connected to the DC node. The third terminal of the capacitor is connected to the RF node and the fourth terminal of the capacitor is connected to the plurality of bases of the transistor.

According to the preferred embodiment, the transistor is a heterojunction bipolar transistor.

According to the preferred embodiment, the ballast resistors are set to maximize uniformity of temperature of a plurality of emitters of the transistor.

According to the preferred embodiment, the capacitor has a substantially high capacitance so that an RF input signal applied at the RF node suffers low signal loss.

It is an advantage of the present invention that the capacitor provides a distinct path for the RF input signal, such that the RF input signal does not suffer significant signal loss.

It is a further advantage of the present invention that the capacitor supplies capacitance that is distributed to each base of the plurality of bases.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
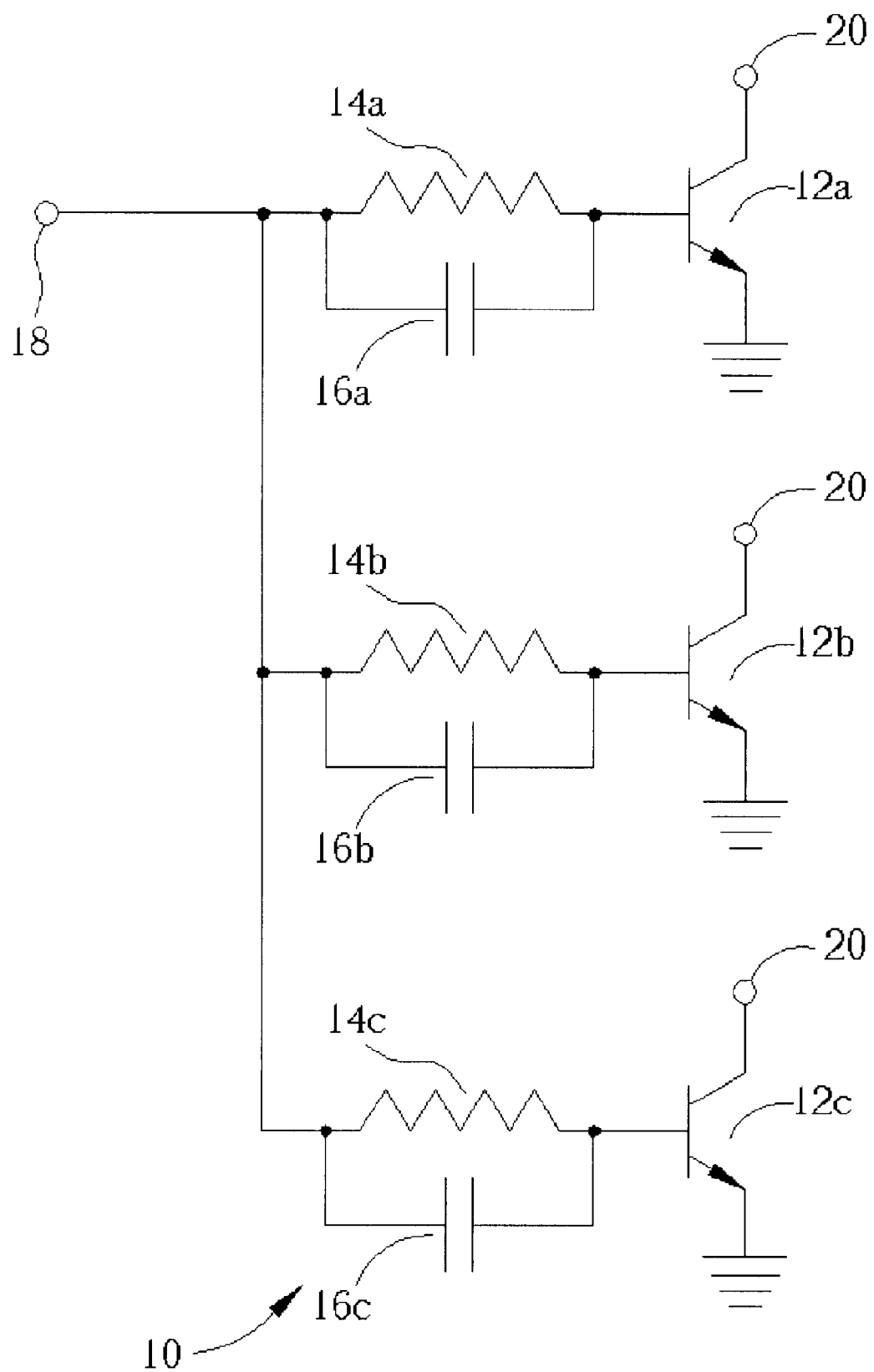
FIG. 1 is a circuit diagram of a power amplifier according to the prior art.
Figure 2:
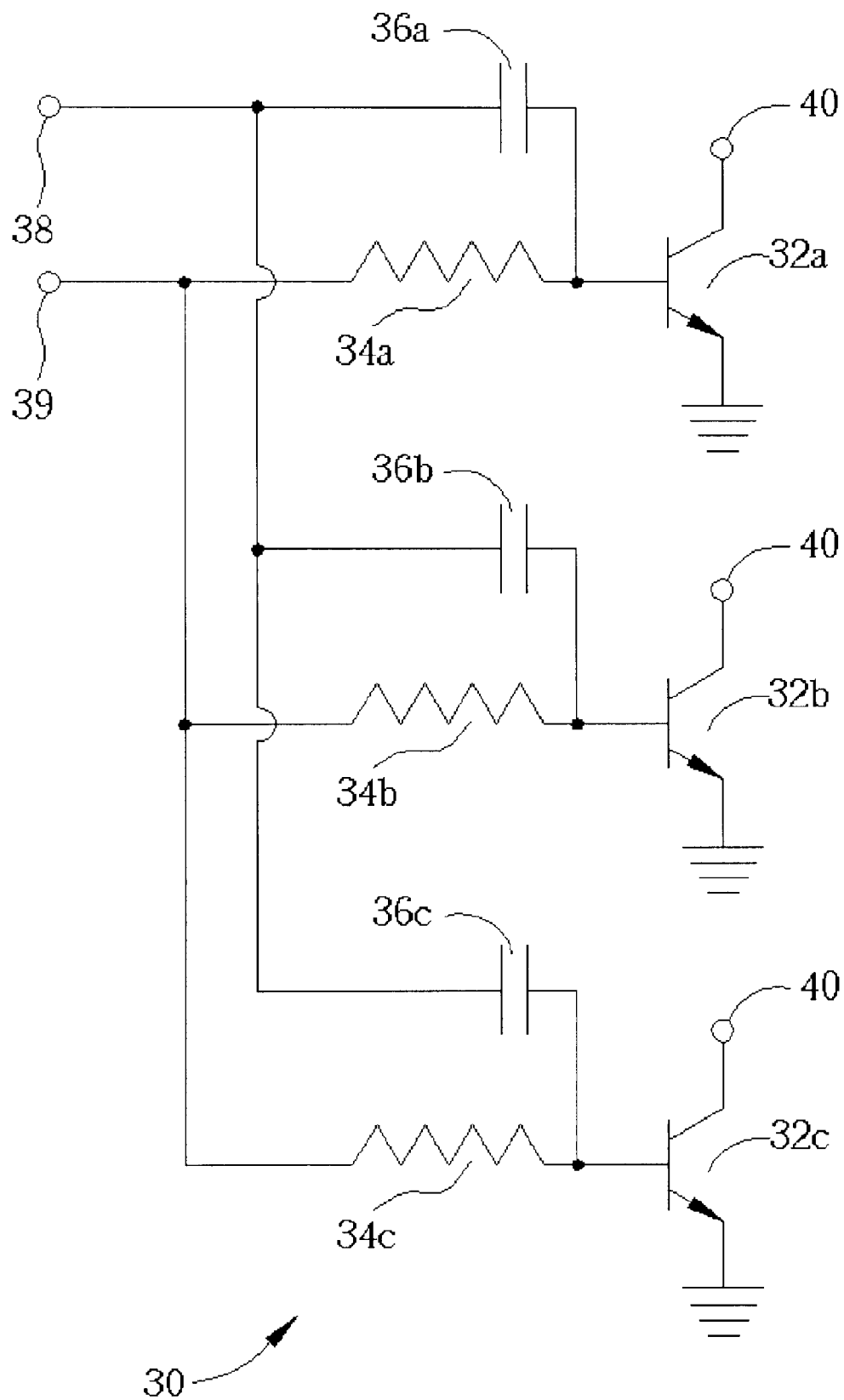
FIG. 2 is a circuit diagram of another prior art power amplifier.
Figure 3:
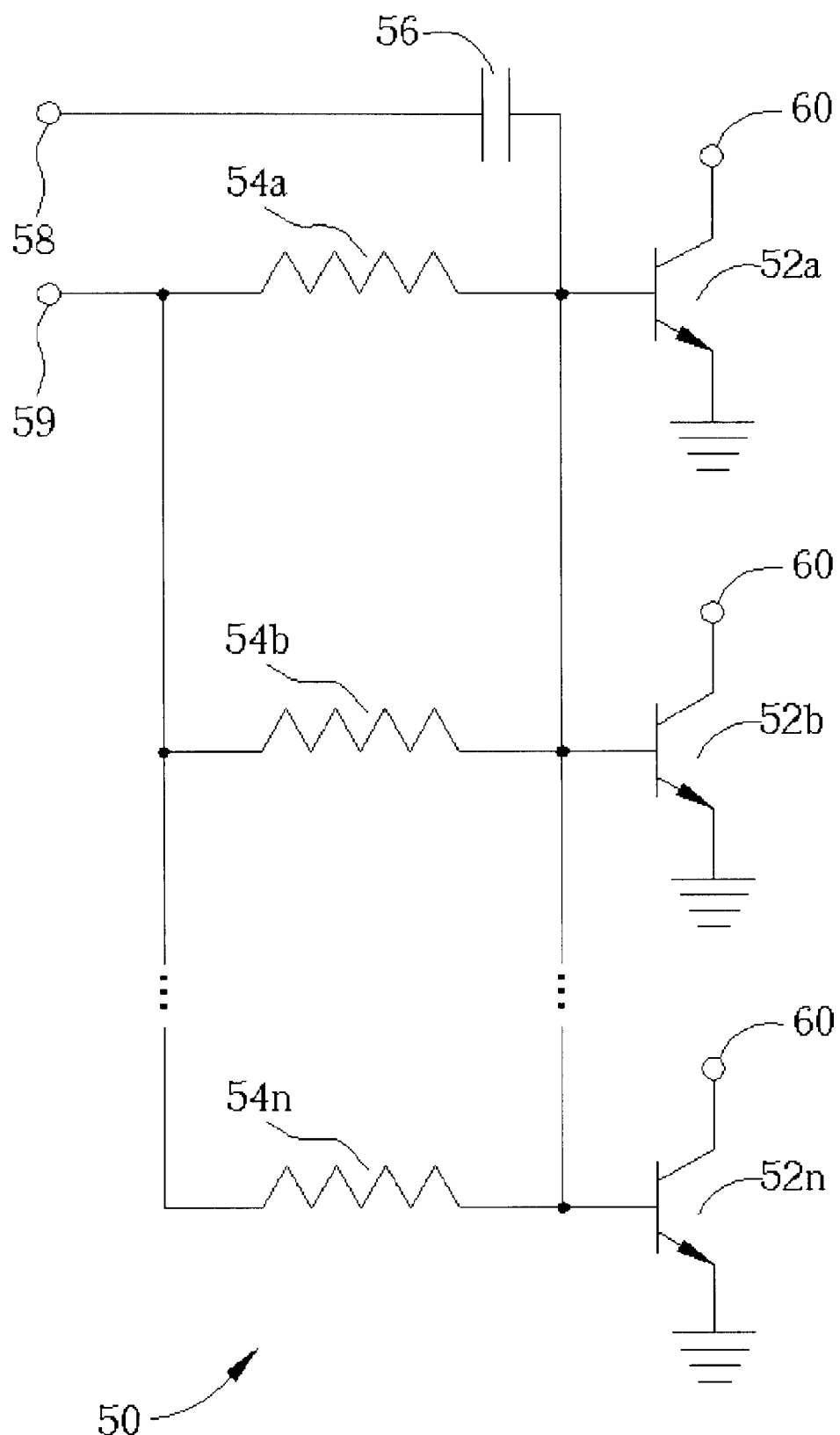
FIG. 3 is a circuit diagram of a power amplifier according to the preferred embodiment of the present invention.

Please refer to FIG. 3. FIG. 3 shows a power amplifier 50 according to the preferred embodiment of the present invention. The power amplifier 50 comprises a plurality of heterojunction bipolar transistors 52a–52n, and each transistors 52a–52n has its own emitter finger and base finger. The quantity of three transistors 52a–52n illustrated in this drawing is not limiting, and more or fewer are acceptable according to the present invention. The power amplifier 50 further includes ballasting resistors 54a–54n corresponding to each transistor 52a–52n to stabilize the power amplifier 50 when operating with a high current density or a high power. A capacitor 56 is provided to couple an RF signal from an RF node 58 to all the bases of the transistors 52a–52n. The capacitance of the capacitor 56 is selected to be a relatively high value considering the resistances of the resistors 54a–54n and the properties of the transistors 52a–52n, and as a result, the RF signal suffers substantially low loss. A node 59 is provided to supply a DC voltage to the bases of the transistors 52a–52n through the ballasting resistors 54a–54n. Output of the power amplifier 50 can be taken from collector nodes 60.

When operating, a DC voltage is supplied at the node 59 and thus to the base of each transistor 52a–52n through the individual ballasting resistors 54a–54n. The RF signal is provided to the node 58 and is coupled to the base of each transistor 52a–52n through the capacitor 56. Losses to the RF signal are minimized by the relatively high capacitance of the capacitor 56, and by the fact that the path of the RF signal does not include the ballasting resistors 54a–54n. Amplified output of the RF signal is taken from the collector nodes 60.

Generally, the base ballasting resistors 54a–54n can be any suitable source of resistance that can dissipate undesirable heat. The selection of resistance values of the resistors 54a–54n is determined with respect to the layout of the power amplifier 50 to maximize uniformity of temperature of emitters of the transistors 52a–52n. The capacitance of the capacitor 56 is selected as relatively high to minimize loss that the RF signal suffers.

It should be noted that the resistors 54a–54n connected in parallel might electrically equal one smaller resistor connected to the bases of all the transistors 52a–52n. However, it is preferable for each transistor 52a–52n to have one resistor for thermal stability due to different base-emitter voltages of each transistor 52a–52n. Respective resistors are suggested in this preferred embodiment.

In practical application, the power amplifier 50 is disposed on an integrated circuit. The heterojunction bipolar transistor as represented by transistors 52a–52n, the resistors 54a–54n, and the capacitor 56 are all fabricated according to standard integrated circuit fabrication practices.

Figure 4:
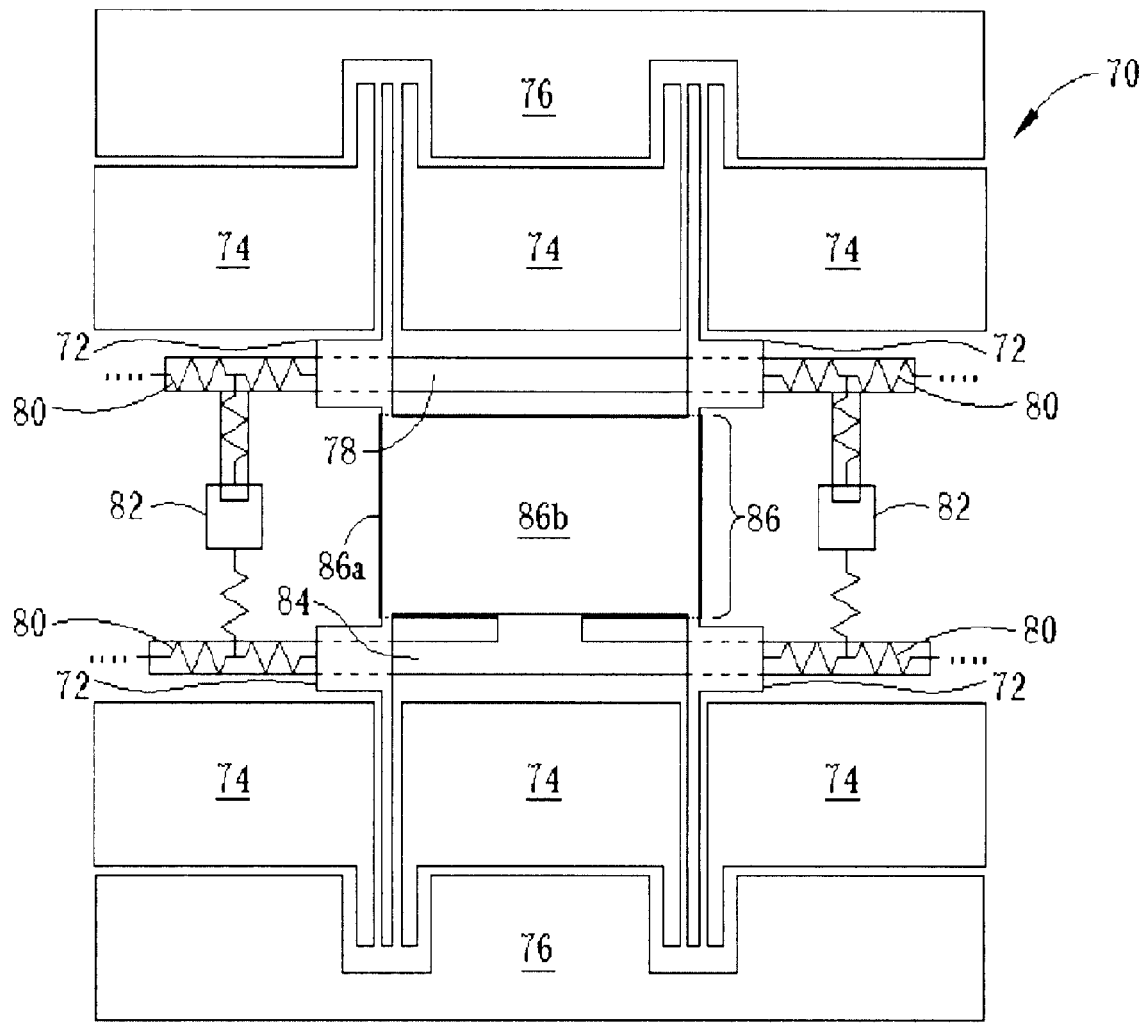
FIG. 4 is a layout diagram of a power amplifier integrated circuit according to the preferred embodiment of the present invention.

Please refer to FIG. 4. FIG. 4 shows a layout diagram of a power amplifier integrated circuit 70 according to the preferred embodiment of the present invention. The power amplifier integrated circuit 70 comprises heterojunction bipolar transistors having bases 72, emitters 74, and collectors 76. A DC path 78 comprising ballasting resistor groups 80 is provided to conduct a DC voltage applied at nodes 82 to the bases 72. An RF path 84 is provided for conducting an RF signal to be coupled to a capacitor 86. The capacitor 86 is made up of two rectangular regions of metallization 86a, 86b disposed on different layers of the integrated circuit 70. The power amplifier integrated circuit 70 illustrates how the power amplifier 50 can be practically realized in one preferred embodiment.

Individual resistors of the ballasting resistor groups 80 can be designed having resistances according to the specific design parameters of the power amplifier integrated circuit 70. Similarly, the two rectangular regions of metallization 86a, 86b can be designed to provide the capacitor 86 with a suitable capacitance given relevant design considerations.

The layout of the power amplifier integrated circuit 70 as shown in FIG. 4 provides for efficient manufacture and improved thermal characteristics. Specifically, the layout allows the emitters 74 to be bumped periodically, such layout is more conducive to positioning backside vias in a manner providing for improved thermal dissipation of excess heat resulting from the operation of the power amplifier integrated circuit 70. As a result, the power amplifier integrated circuit 70 can handle more power/current than prior art designs.

Operation of the power amplifier integrated circuit 70 is effectively the same as the previously described operation of the power amplifier 50.

In contrast to the prior art, the present invention power amplifier provides a capacitor that is distributed to a plurality of bases of heterojunction bipolar transistors. The capacitance of the capacitor can be set to minimize loss to an RF signal. Of equal importance, the layout of the present invention power amplifier integrated circuit offers improved thermal characteristics. The power amplifier circuit according to the present invention is more efficient than the prior art, and can reduce cost and fabrication time.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A power amplifier integrated circuit consisting essentially of:
   a plurality of transistors each comprising a base;
   a plurality of ballast resistors corresponding to the plurality of transistors, each ballast resistor having a first terminal and a second terminal, the first terminal connected to the base of the corresponding transistor;
   a DC node to which the second terminals of the plurality of ballast resistors are connected;
   an RF node for supplying an RF input signal; and
   a capacitor having a third terminal and a fourth terminal, the third terminal connected to the RF node and the fourth terminal connected to the plurality of bases.

2. The power amplifier integrated circuit of claim 1 wherein the transistors are heterojunction bipolar transistors.

3. The power amplifier integrated circuit of claim 1 wherein the capacitor has a substantially high capacitance so that the RF input signal applied at the RF node suffers low signal loss through the power amplifier integrated circuit.

4. The power amplifier integrated circuit of claim 1 wherein the capacitor comprises two regions of metallization in two different layers of a semiconductor.

5. The power amplifier integrated circuit of claim 1 wherein the ballast resistors are set to maximize uniformity of temperature of a plurality of emitters of the transistors.

6. The power amplifier integrated circuit of claim 1 being a portion of a wired or wireless system application.

7. The power amplifier integrated circuit of claim 1 being a portion of a mobile telephone.

8. A semiconductor device comprising:
   a semiconductor substrate;
   a DC node for receiving a DC voltage;
   an RF node for receiving an RF input signal;
   a plurality of transistors formed on the semiconductor substrate, each of the plurality of transistors having a base;
   a plurality of resistors formed on the semiconductor substrate and corresponding to the plurality of transistors, each resistor having a first terminal and a second terminal, the first terminal connected to the base of the corresponding transistor, the second terminal connected to the DC node; and
   a capacitor formed on the semiconductor substrate, the capacitor having a third terminal and a fourth terminal, the third terminal connected to the RF node and the fourth terminal connected to more than one of the plurality of bases so that the capacitor evenly couples the RF input signal to the more than one of the plurality of bases.

9. The semiconductor device of claim 8 wherein the transistors are heterojunction bipolar transistors.

10. The semiconductor device of claim 8 wherein the capacitor comprises two regions of metallization in two different layers of the semiconductor device.

11. The semiconductor device of claim 8 wherein the capacitor comprises a first region of metallization in a first layer and a second region of metallization in a second layer different from the first layer, the first terminal of the resistor is connected to the base of the corresponding transistor in the first region, and the fourth terminal of the capacitor is connected to more than one of the plurality of bases in the second region.

12. The semiconductor device of claim 8 further comprising additional pluralities of transistors and resistors and corresponding capacitors, wherein sets of an equal number of the transistors and resistors and a capacitor form a power amplifier integrated circuit.

13. The semiconductor device of claim 12 wherein each set comprises four transistors, four resistors, and one capacitor.

14. A power amplifier integrated circuit formed on a semiconductor substrate, the power amplifier integrated circuit comprising at least one set of components, each set comprising:

a DC node for receiving a DC voltage;

an RF node for receiving an RF input signal;

a plurality of transistors formed on the semiconductor substrate, each of the plurality of transistors having a base;

a plurality of resistors formed on the semiconductor substrate and corresponding to the plurality of transistors, each resistor having a first terminal and a second terminal, the first terminal connected to the base of the corresponding transistor, the second terminal connected to the DC node; and a capacitor formed on the semiconductor substrate, the capacitor having a third terminal and a fourth terminal, the third terminal connected to the RF node and the fourth terminal connected to more than one of the plurality of bases;

wherein the pluralities of transistors and resistors are disposed on the semiconductor substrate and located surrounding the capacitor.

15. The power amplifier integrated circuit of claim 14 wherein the capacitor comprises a first region of metallization in a first layer and a second region of metallization in a second layer different from the first layer, the first terminal of the resistor is connected to the base of the corresponding transistor in the first region, and the fourth terminal of the capacitor is connected to more than one of the plurality of bases in the second region.

* * * * *